US008151229B1

(12) United States Patent
Chang et al.

(10) Patent No.: US 8,151,229 B1
(45) Date of Patent: Apr. 3, 2012

(54) SYSTEM AND METHOD OF COMPUTING PIN CRITICALITIES UNDER PROCESS VARIATIONS FOR TIMING ANALYSIS AND OPTIMIZATION

(75) Inventors: Hongliang Chang, Cupertino, CA (US); Oleg Levitsky, San Jose, CA (US); Nikolay Rubanov, San Jose, CA (US); Vassilios Gerousis, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 201 days.

(21) Appl. No.: 11/733,749

(22) Filed: Apr. 10, 2007

(51) Int. Cl.
*G06F 17/50* (2006.01)
(52) U.S. Cl. ....................................... 716/108
(58) Field of Classification Search ................. 716/1, 6, 716/100, 108
See application file for complete search history.

(56) References Cited

U.S. PATENT DOCUMENTS

| | | | | |
|---|---|---|---|---|
| 7,020,589 B1* | 3/2006 | Datta Ray et al. | ............... | 703/2 |
| 7,133,819 B1* | 11/2006 | Hutton | ............... | 703/19 |
| 2003/0226122 A1* | 12/2003 | Hathaway et al. | ............... | 716/2 |
| 2004/0002844 A1* | 1/2004 | Jess et al. | ............... | 703/14 |
| 2005/0066298 A1* | 3/2005 | Visweswariah | ............... | 716/6 |
| 2006/0064658 A1* | 3/2006 | Minonne et al. | ............... | 716/6 |
| 2007/0143722 A1* | 6/2007 | Venkateswaran et al. | ............... | 716/6 |
| 2007/0156367 A1* | 7/2007 | Kucukcakar et al. | ............... | 702/123 |
| 2007/0226667 A1* | 9/2007 | Chadwick et al. | ............... | 716/6 |
| 2008/0059143 A1* | 3/2008 | Chiu et al. | ............... | 703/14 |
| 2008/0072198 A1* | 3/2008 | Celik et al. | ............... | 716/6 |
| 2008/0163149 A1* | 7/2008 | Curtin et al. | ............... | 716/8 |
| 2008/0209376 A1* | 8/2008 | Kazda et al. | ............... | 716/6 |
| 2008/0216038 A1* | 9/2008 | Bose | ............... | 716/8 |
| 2008/0270962 A1* | 10/2008 | Chadwick et al. | ............... | 716/6 |
| 2009/0100393 A1* | 4/2009 | Visweswariah et al. | ............... | 716/6 |
| 2009/0235133 A1* | 9/2009 | Kapur et al. | ............... | 714/726 |
| 2010/0162064 A1* | 6/2010 | Shi et al. | ............... | 714/738 |
| 2010/0306724 A1* | 12/2010 | Kim et al. | ............... | 716/6 |

OTHER PUBLICATIONS

Clark, C. The Greatest of a Finite Set of Random Variables, p. 145-162, Operations Research, Mar.-Apr. 1961.
Li, X. ; Le, J.; Celik, M.; Pileggi, L. Defining Statistical Sensitivity for Timing Optimization of Logic Circuits with Large- Scale Process and Environmental Variations. Jun. 2005. p. 1-8. Extreme DA. Palo Alto, CA.
Visweswariah, C.; Ravindran, K.; Kalafala, K.; Walker, S.G ;Narayan, S. First-Order Incremental Block-Based Statistical Timing Analysis. DAC Jun. 2004. San Diego, CA. p. 1-6.
Chang, H.; Sapatnekar, S. Statistical Timing Analysis Considering Spatial Correlations Using a Single Pert-Like Traversal. Nov. 2003. p. 621-625. ICCAD '03. San Jose, CA.

* cited by examiner

*Primary Examiner* — Suchin Parihar
(74) *Attorney, Agent, or Firm* — Alford Law Group, Inc.; William E. Alford; George L. Fountain

(57) ABSTRACT

A system and method for determining the criticality of each timing pin in a circuit design are disclosed. The criticality of a timing pin is the probability that the timing pin is on the path with the worst slack in the circuit design. According to the methodology, the slack for each timing pin is calculated, wherein each slack is a function of a process random variable. Then, the criticality of each timing pin is determined as the probability of the timing pin having the minimum slack among the slacks in an independent critical set of timing pins. The criticality of each timing pin may then be normalized. By determining the criticalities of the timing pins in a circuit design, a circuit design system may be able to more easily identify portions of the circuit design that need modification for timing and other purposes.

23 Claims, 7 Drawing Sheets

SYSTEM AND METHOD OF COMPUTING PIN CRITICALITIES UNDER PROCESS VARIATIONS FOR TIMING ANALYSIS AND OPTIMIZATION

FIELD OF THE INVENTION

This invention relates generally to integrated circuit design systems, and in particular, to a system and method of computing timing pin criticalities under process variations for timing analysis and optimization.

BACKGROUND OF THE INVENTION

Integrated circuits have become extremely large and complex, typically including millions of components. Accordingly, the design of integrated circuits is also very complex and time consuming, involving synthesizing, analyzing and optimizing many circuit parameters. Because of this complexity, electronic design automation (EDA) systems have been developed to assist designers in developing integrated circuits at multiple levels of abstraction.

In EDA systems, static timing analysis (STA) modules are used to analyze and optimize the timing parameters of an integrated circuit design. These modules typically analyze the timing of a circuit design using nominal or worst case timing values. However, due to semiconductor process and environmental variations, the actual circuit delays rarely assume their respective nominal or worst case timing values. Thus, statistical static timing analysis (SSTA) tools have been developed to perform timing analysis on circuit designs using probabilities for the circuit delay values.

SUMMARY OF THE INVENTION

The invention is summarized by the claims that follow below.

DETAILED DESCRIPTION OF THE EXEMPLARY EMBODIMENTS

In the following detailed description of the embodiments of the invention, numerous specific details are set forth in order to provide a thorough understanding of the present invention. However, it will be obvious to one skilled in the art that the embodiments of the invention may be practiced without these specific details. In other instances, well known methods, procedures, components, and circuits have not been described in detail so as not to unnecessarily obscure aspects of the embodiments of the invention.

Figure 1:
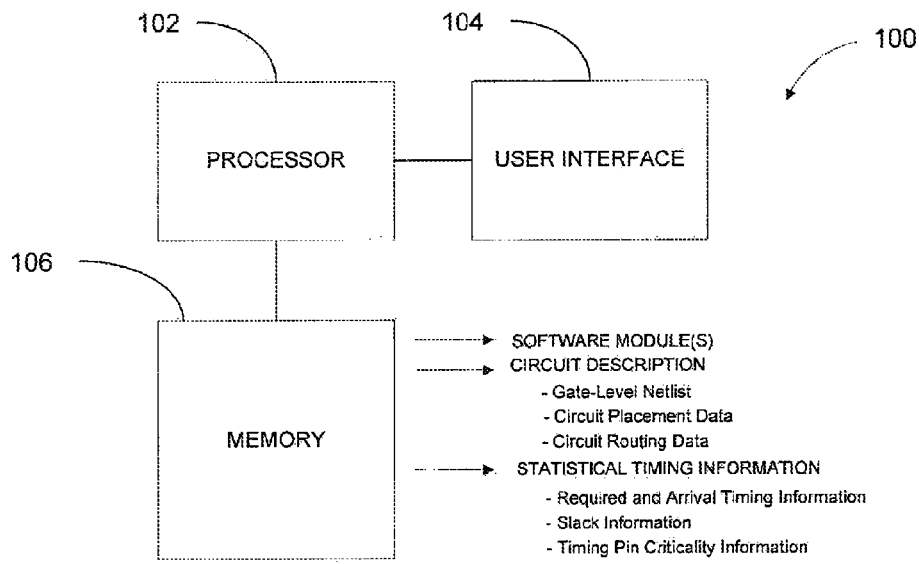
FIG. 1 illustrates a block diagram of an exemplary system for designing circuits in accordance with an embodiment of the invention.

FIG. 1 illustrates a block diagram of an exemplary circuit design system 100 for designing circuits in accordance with an embodiment of the invention. As discussed in more detail below, the circuit design system 100 is capable of computing the criticalities of timing pin for all pins based on the slacks of the pins and arcs in the circuit design. The circuit design system 100 is further capable of ordering the criticalities of the timing pins for the purpose of identifying timing issues with the circuit design. Using the ordering of the pin criticalities, the circuit design system 100 is further capable of optimizing the circuit design to achieve a desired timing performance for the circuit. These features and others are better explained with reference to the following exemplary embodiments.

In particular, the circuit design system 100 may be configured as a computer system comprising one or more processors 102, a user interface 104, and a memory 106. Under the control of one or more software modules, the processor 102 performs the various operations of the circuit design system 100, including logic synthesis, component placement, interconnect routing, and statistical timing analysis and optimization. The one or more processors 102 may be any type of data processing device, including microprocessors, microcontrollers, reduced instruction set computer (RISC) processors, networked computer systems, etc.

The user interface 104 allows a user to send and receive information to and from the processor 102, as well as control the various operations performed by the processor 102. For example, the user interface 104 may comprise one or more input devices, such as a keyboard, a pointing device (e.g., a mouse, a track ball), a touch-sensitive display, microphone, etc. The user interface 104 may also comprise one or more output devices, such as a display (including a touch-sensitive display), speakers, etc. Using the one or more input devices of the user interface 104, a user may specify an input circuit description in any of a number of formats, including hardware description language (HDL), such as VHDL or Verilog, or resistor-transistor logic (RTL) language. Using one or more output devices of the user interface 104, a user may view the results of the circuit design operations performed by the processor 102. The user may also control the circuit design operations performed by the processor 102 using the user interface 104.

The memory 106 may be any one or more computer readable mediums (e.g., RAM, ROM, magnetic hard disks, optical storage discs, etc.) for storing one or more software modules that control the processor 102 perform its various operations, as well as information that the processor 102 uses in performing the circuit design methodology described herein. Such information may include the input circuit description specified by a user, a gate-level netlist generated by a logic synthesis operation, component placement data generated by a placement operation, interconnect routing data generated by a routing operation, and criticalities of timing pins and arcs and supporting data generated by a statistical timing analysis and optimization operation.

Figure 2:
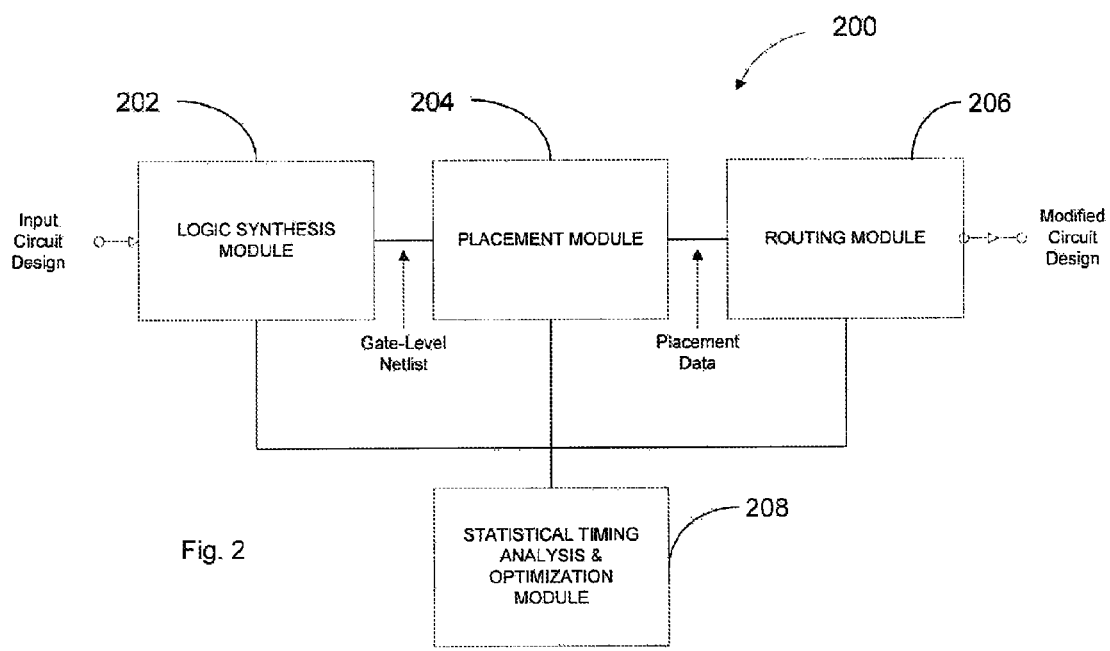
FIG. 2 illustrates a block diagram of exemplary software modules used in the exemplary circuit design system in accordance with another embodiment of the invention.

FIG. 2 illustrates a block diagram of an exemplary software suite 200 used by the circuit design system 100 in performing its circuit design function in accordance with another embodiment of the invention. The software suite 200 includes a logic synthesis module 202, a placement module 204, a routing module 206, and a statistical timing analysis and optimization module 208. It shall be understood that the software suite 200 may include additional circuit analysis and optimization modules, such as a floor planning module, etc. The logic synthesis module 202 generates a gate-level netlist from an input circuit description specified by a user using the user interface 104. The placement module 204 generates a layout of the cells of the circuit design defined by the gate-level netlist. The routing module 206 routes interconnects to electrically connect the cells of the circuit design layout.

The statistical timing analysis and optimization module 208 performs statistical timing analysis and optimization of the circuit design at one or more levels of abstraction. For example, the module 208 is coupled to the logic synthesis module 202 to perform statistical timing analysis and optimization on the gate-level netlist. The module 208 is also coupled to the placement module 204 to perform statistical timing analysis and optimization on the circuit design layout. The module 208 is also coupled to the routing module 206 to perform statistical timing analysis and optimization on the routed circuit design layout to generate a modified circuit design.

As discussed in more detail below, the statistical timing analysis and optimization module 208 computes the criticalities of timing pins based on the slacks of the pins and arcs of the circuit design. The module 208 also sorts the pin criticalities in order to identify and attempt to resolve timing issues with the circuit design. Further, the module 208 also optimizes the circuit design based on the pin criticalities previously calculated. These operations are further explained with reference to the following operations further described herein.

Figure 3:
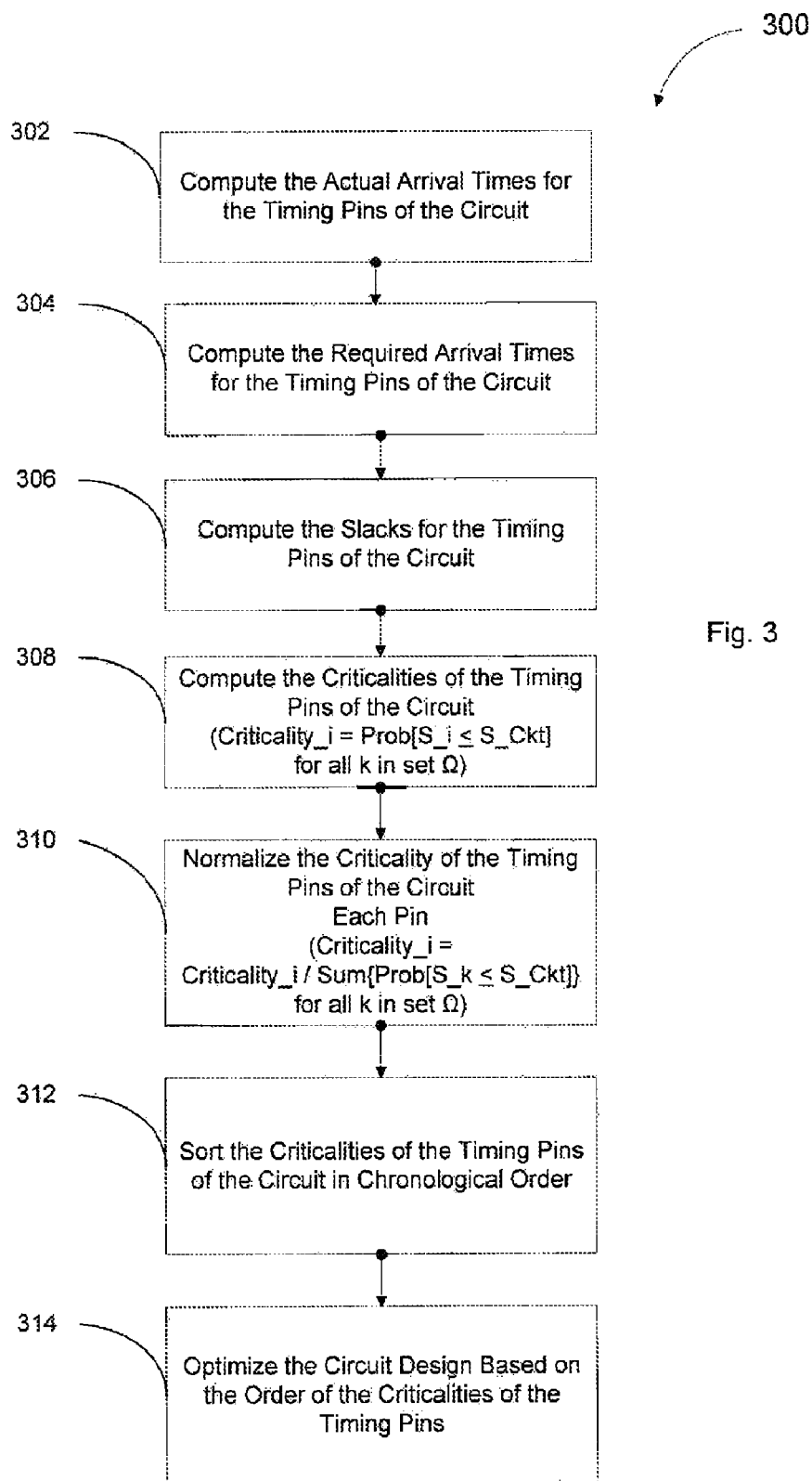
FIG. 3 illustrates a flow diagram of an exemplary method of computing the criticalities of timing pins in accordance with another embodiment of the invention.

FIG. 3 illustrates a flow diagram of an exemplary method 300 of computing the criticalities of timing pins of a circuit design in accordance with another embodiment of the invention. The criticality of a timing pin (also commonly referred to as a node) is the probability of the timing pin being on a critical path. A critical path, in turn, is a path of a circuit design that has the minimum slack. Note that under process variation, one path can be a critical path when process parameters take a particular set of values with certain probability, but another path can be a critical path when the process parameters take a different set of values with certain probability.

The determination of pin criticalities for a circuit design is useful when optimizing the circuit design to achieve timing objectives. For example, pin criticalities help identify portions of the circuit design that are not meeting or marginally meeting timing requirements. These may be portions having negative or slightly positive slacks. Pin criticalities also identify portions of the circuit design that meet timing requirements with room to spare. These may be portions having relatively large positive slacks. As discussed in more detail further, an optimization routine may spend significant resources to optimize a portion of a circuit design having a relatively high pin criticality. On the other hand, the optimization routine may sacrifice some timing performance for other improvements in a portion of a circuit design having a relatively low pin criticality.

The method 300 is explained herein with reference to an example circuit design 400 and associated statistical timing information shown in FIGS. 4A-E. In this example, the circuit design 400 includes buffers 402, 404, 406, and 410, AND-gate 408, OR-gate 412, and a pair of flip-flops 414 and 416. The outputs of the buffers 402 and 404 are coupled to respective inputs of AND-gate 408. The output of buffer 406 is coupled to an input of OR-gate 412. The output of the AND-gate 408 is coupled to another input of the OR-gate 412 and to the input of buffer 410. The output of buffer 410 is coupled to the input of the flip-flop 414. The output of the OR-gate 412 is coupled to the input of the flip-flop 416.

In this example, there is no delay of the signals at the inputs of buffers 402 and 404, and a delay of four (4) of the signal at the input of buffer 406. The delay associated with the buffer 402 has a mean value of 7, a sensitivity of 0.5 with respect to a first process variable $x_1$, and a sensitivity of 0.5 with respect to a second process variable $x_2$. The first and second process variable $x_1$ and $x_2$ may be related to the delay associated respectively with a number of process variables, such as the variation of the gate length of a transistor, the variation of the gate width of a transistor, variation of the thickness of the gate oxide of a transistor, variation of metal line width, variation of metal line height, and others. In this example, each process variable is modeled as a Gaussian distribution, however, other probability density distributions may be applicable. Also, in this example, only two process variables are used to illustrate the embodiments of the invention. It shall be understood that the delay associated with a gate may have more or less process variables.

Accordingly, in the exemplary circuit design 400, the delays associated with the gates are as follows:

| GATE | DELAY |
| --- | --- |
| 402 | $7 + 0.5x_1 + 0.5x_2$ |
| 404 | $7 + 0.5x_1 + 0.5x_2$ |
| 406 | $12 + 2.5x_1 + x_2$ |
| 408 | $10 + x_1 + x_2$ |
| 410 | $15 + 1.5x_1 + x_2$ |
| 412 | $15 + x_1 + 2x_2$ |

The delays are also illustrated next to the corresponding gates shown in FIG. 4A.

Figure 4A:
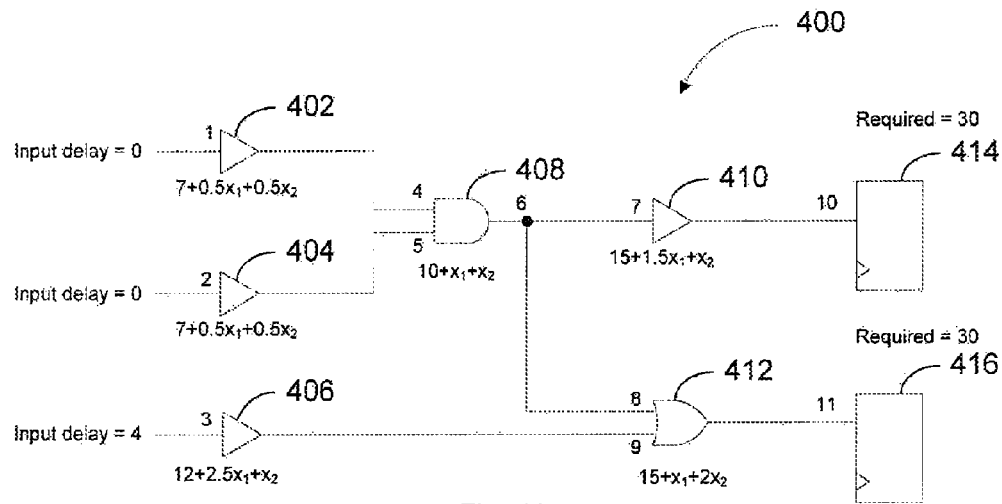
FIG. 4A illustrates an exemplary circuit design and associated delay information in accordance with another embodiment of the invention.
Figure 4B:
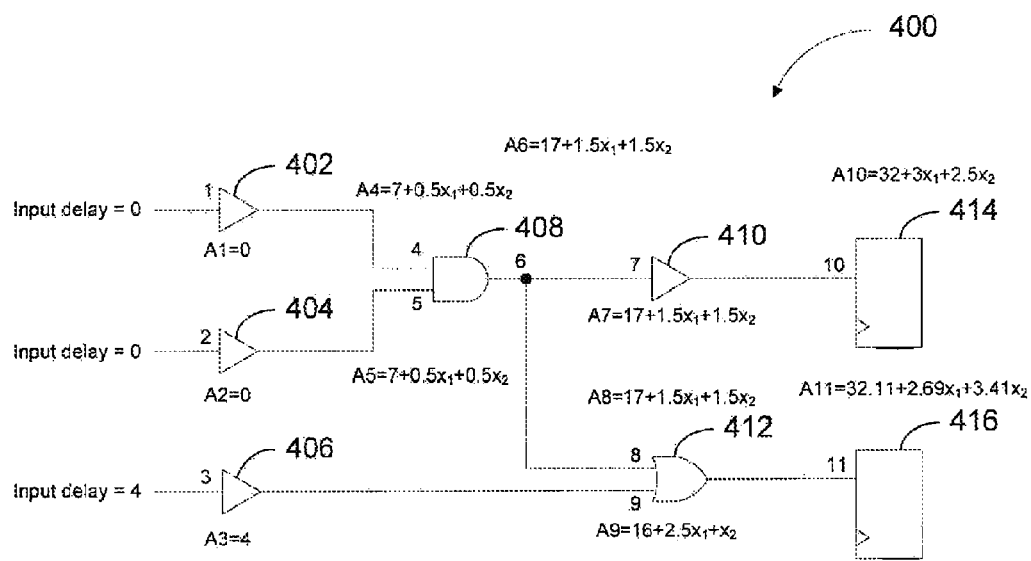
FIG. 4B illustrates the exemplary circuit design and associated actual arrival time information in accordance with another embodiment of the invention.

Referring to FIGS. 3 and 4A-B, according to the method 300, the statistical timing analysis and optimization module 208 first computes the actual arrival times for the timing pins of the circuit design (block 302). The actual arrival times may be computed by performing a forward traversal to determine the cumulative delay for each timing pin. For example, the actual arrival times associated with timing pins 1-3 at the respective inputs of the buffers 402, 404, and 406 are the input delays 0, 0, and 4, respectively. The actual arrival times for timing pins 4 and 5 at the respective inputs to the AND-gate 408 are the actual arrival times of timing pins 1 and 2 plus the delays associated with the buffers 402 and 404, respectively. Thus, the actual arrival time for both timing pins 4 and 5 is $7+0.5x_1+0.5x_2$.

Since the actual arrival times for timing pins 4 and 5 at the inputs of AND-gate 408 are the same, the actual arrival time for timing pins 6-8 is the actual arrival time at pin 4 or 5 plus the delay associated with AND-gate 408. Thus, the actual arrival time of timing pins 6-8 is $17+1.5x_1+1.5x_2$. The actual arrival time of timing pin 9 is the actual arrival time at the input of the buffer 406 plus the delay associated with the buffer 406. Thus, the actual arrival time of timing pin 9 is $16+2.5x_1+x_2$. The actual arrival time of timing pin 10 is the actual arrival time at timing pin 7 plus the delay associated with buffer 410. Thus, the actual arrival time of timing pin 10 is $32+3x_1+2.5x_2$.

Because the actual arrival times for timing pins 8 and 9 at the inputs of OR-gate 412 are different, the actual arrival time for timing pin 11 may be determined by techniques for calculating the maximum of a finite set of random variables. One example of such techniques is discussed in Hongliang Chang, et al., "Statistical Timing Analysis Considering Spatial Correlations Using a Single Pert-Like Traversal", ICCAD (2003). In this example, the actual arrival time for pin 11 would be the maximum of actual arrival times of pins 8 and 9 plus the delay associated with OR-gate 412 ($\max(32+2.5x_1+3.5x_2; 31+3.5x_1+3x_2)$). Calculating this maximum, the actual arrival time for timing pin 11 is $32.11+2.69x_1+3.41x_2$.

The following table summarizes the actual arrival times for the timing pins of the circuit design 400:

| TIMING PINS | ARRIVAL |
|---|---|
| 1 | 0 |
| 2 | 0 |
| 3 | 4 |
| 4 | $7 + 0.5x_1 + 0.5x_2$ |
| 5 | $7 + 0.5x_1 + 0.5x_2$ |
| 6 | $17 + 1.5x_1 + 1.5x_2$ |
| 7 | $17 + 1.5x_1 + 1.5x_2$ |
| 8 | $17 + 1.5x_1 + 1.5x_2$ |
| 9 | $16 + 2.5x_1 + x_2$ |
| 10 | $32 + 3x_1 + 2.5x_2$ |
| 11 | $32.11 + 2.69x_1 + 3.41x_2$ |

The actual arrival times are also illustrated next to the corresponding timing pins shown in FIG. 4B.

Figure 4C:
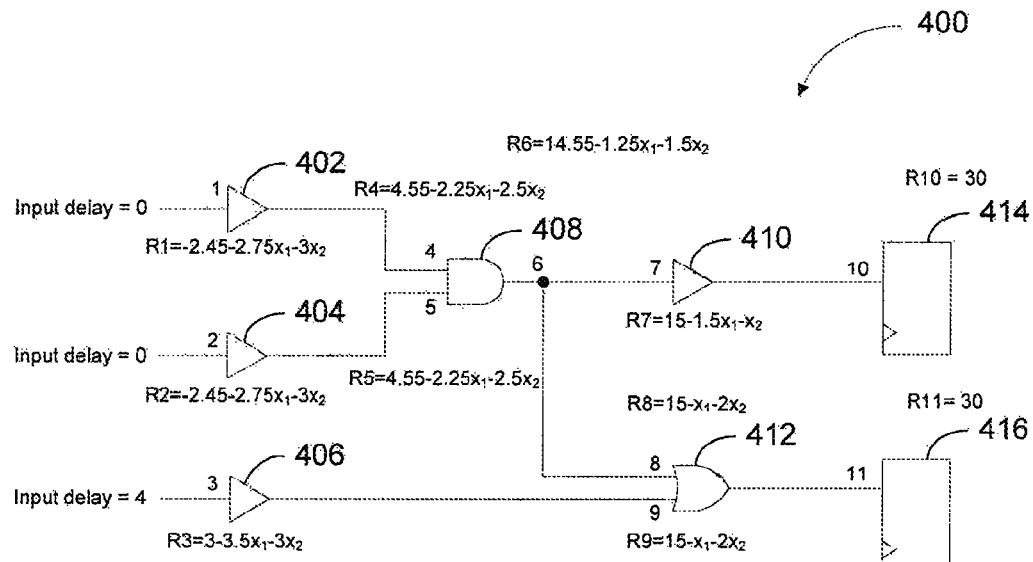
FIG. 4C illustrates the exemplary circuit design and associated required arrival time information in accordance with another embodiment of the invention.

With further reference to FIG. 4C, then, according to the method 300, the statistical timing analysis and optimization module 208 computes the required arrival times for the timing pins of the circuit design (block 304). The required arrival times may be computed by performing a backward traversal to determine the required arrival time for each timing pin from the required arrival time at the end points of the timing graph. In this example, the required arrival times at the end points, timing pins 10 and 11, are both 30.

The required arrival time of timing pin 7 is required arrival time at timing pin 10 minus the delay associated with buffer 410. Accordingly, the required arrival time for timing pin 7 is $15-1.5x_1-1.5x_2$. The required arrival time for both timing pins 8 and 9 is the required arrival time at timing pin 11 minus the delay associated with OR-gate 412. Accordingly, the required arrival time for timing pins 8-9 is $15-x_1-2x_2$.

Since the delays associated with buffer 410 and OR-gate 412 are different, the required arrival time for timing pin 6 may be calculated by techniques of determining the minimum of a finite set of random variables. In this example, the required arrival time for pin 6 would be the minimum of required arrival times of pins 7 and 9 ($\min(15-1.5x_1-x_2; 15-x_1-2x_2)$). Calculating this minimum, the required arrival time for timing pin 6 is $14.55-1.25x_1-1.5x_2$. The required arrival time for timing pins 4 and 5 is the required arrival time of timing pin 6 minus the delay associated with AND-gate 408. Accordingly, the required arrival time for timing pins 4 and 5 is $4.55-2.25x_1-2.5x_2$.

The required arrival time of timing pin 1 is the required arrival time of timing pin 4 minus the delay of buffer 402. Accordingly, the required arrival time of timing pin 1 is $-2.45-2.75x_1-3x_2$. Similarly, the required arrival time of timing pin 2 is the required arrival time of timing pin 5 minus the delay of buffer 404. Accordingly, the required arrival time of timing pin 2 is $-2.45-2.75x_1-3x_2$. The required arrival time of timing pin 3 is the required arrival time of timing pin 9 minus the delay of buffer 406. Accordingly, the required arrival time of timing pin 3 is $3-3.5x_1-3x_2$.

The following table summarizes the required arrival times for the timing pins of the circuit design 400:

| TIMING PINS | REQUIRED |
|---|---|
| 1 | $-2.45 - 2.75x_1 - 3x_2$ |
| 2 | $-2.45 - 2.75x_1 - 3x_2$ |
| 3 | $3 - 3.5x_1 - 3x_2$ |
| 4 | $4.55 - 2.25x_1 - 2.5x_2$ |
| 5 | $4.55 - 2.25x_1 - 2.5x_2$ |
| 6 | $14.55 - 1.25x_1 - 1.5x_2$ |
| 7 | $15 - 1.5x_1 - x_2$ |
| 8 | $15 - x_1 - 2x_2$ |
| 9 | $15 - x_1 - 2x_2$ |
| 10 | 30 |
| 11 | 30 |

The required arrival times are also illustrated next to the corresponding timing pins shown in FIG. 4C.

Figure 4D:
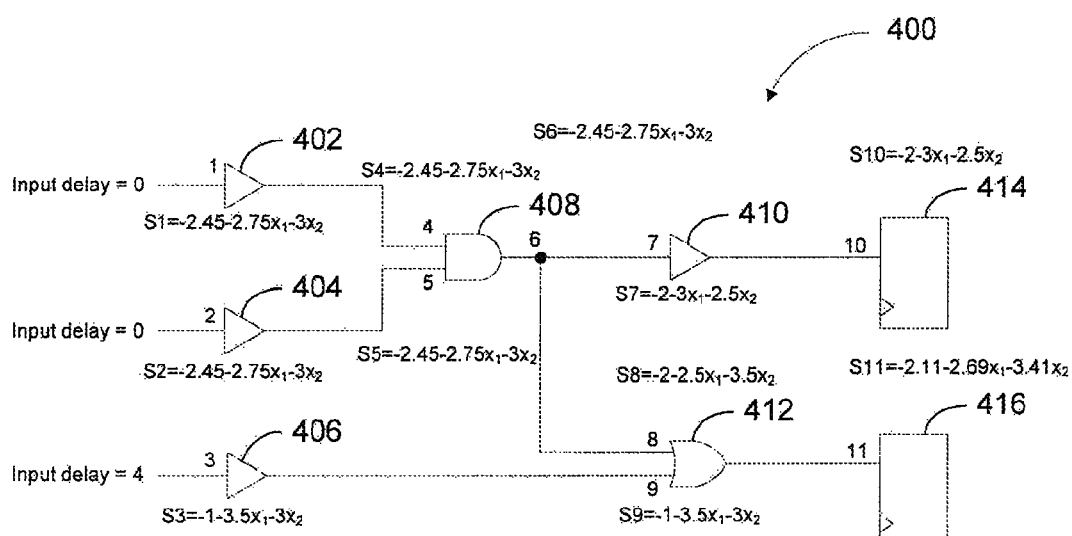
FIG. 4D illustrates the exemplary circuit design and associated slack information in accordance with another embodiment of the invention.

With further reference to FIG. 4D, then, according to the method 300, the statistical timing analysis and optimization module 208 then computes the slacks for the timing pins of the circuit design (block 306). In this example, each slack is modeled as a random variable representing a minimum slack of all paths passing through the corresponding timing pin. The slacks for each timing pin may be computed by subtracting the actual arrival time from the required arrival time. The following table summarizes the slacks of the timing pins of the circuit design 400:

| TIMING PINS | SLACKS |
|---|---|
| 1 | $-2.45 - 2.75x_1 - 3x_2$ |
| 2 | $-2.45 - 2.75x_1 - 3x_2$ |
| 3 | $-1 - 3.5x_1 - 3x_2$ |
| 4 | $-2.45 - 2.75x_1 - 3x_2$ |
| 5 | $-2.45 - 2.75x_1 - 3x_2$ |
| 6 | $-2.45 - 2.75x_1 - 3x_2$ |
| 7 | $-2 - 3x_1 - 2.5x_2$ |
| 8 | $-2 - 2.5x_1 - 3.5x_2$ |
| 9 | $-1 - 3.5x_1 - 3x_2$ |
| 10 | $-2 - 3x_1 - 2.5x_2$ |
| 11 | $-2.11 - 2.69x_1 - 3.41x_2$ |

The slacks are also illustrated next to the corresponding timing pins shown in FIG. 4D.

Then, according to the method 300, the statistical timing analysis and optimization module 208 determines the criticalities of the timing pins of the circuit design 400 from the computed slacks (block 308). In this example, the criticality of the ith timing pin is the probability that the slack ($S\_i$) for the ith timing pin or arc is equal to or less than the slacks $S\_Ckt$ of the timing pins for the corresponding special sub-independent critical set $\Omega$. A special subset of independent critical set is a critical set that not any two pins and/or arcs have the same slack. An independent critical set is a critical set that not any two pins or any two arcs in are connected. A critical set is a set of pins and/or arcs that covers all paths in the circuit. The independent critical set of a timing pin can be determined by the following: For a timing pin in topological level k, the independent critical set of the pin is the set of pins in the same topological level k and those arcs with source pin in levels <k and sink pin in levels >k+1.

Figure 4E:
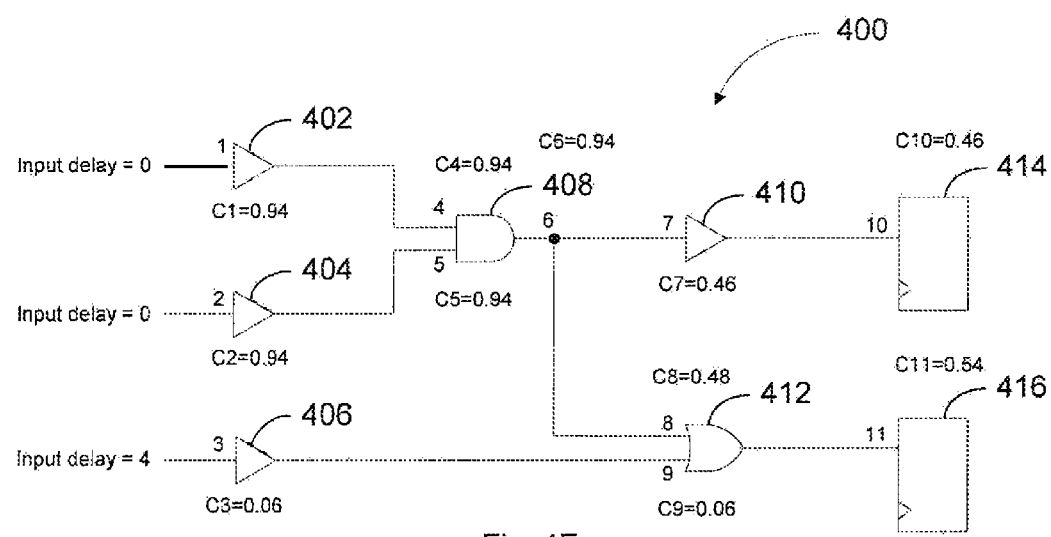
FIG. 4E illustrates the exemplary circuit design and associated timing pin criticality information in accordance with another embodiment of the invention.

With reference to both FIGS. 4D and 4E, the first independent critical set is timing pins 1-3. This is because timing pins 1-3 lie in the same topological level (e.g., level 1). Then the minimum of the slacks S1, S2, and S3 of the timing pins 1-3 is determined. The slacks S1-3 are respectively $-2.45-2.75x_1-3x_2$, $-2.45-2.75x_1-3x_2$, and $-1-3.5x_1-3x_2$. The minimum of these slacks (min(S1, S2, S3) may be determined by known techniques for calculating the minimum of a finite set of random variables. In this example, the min(S1,S2,S3) is equal to $-2.46-2.77x_1-3x_2$.

The criticality of timing pin 1 is then determined by prob (S1≦min(S1, S2, S3)) which may be determined as follows:

criticality 1=prob(S1−min(S1,S2,S3)≦0)= prob($-2.45-2.75x_1-3x_2-(-2.46-2.77x_1-3x_2$)≦0)=prob($0.01+0.02x_1$≦0)

Then, using a probability distribution table with inputs 0.01 and 0.02 serving as the mean and standard deviation values, the criticality of timing pin 1 is determined to be 0.31. Since, in this example, the slack of timing pin 2 is the same as the slack of timing pin 1, the criticality of timing pin 2 is the same as the criticality of timing pin 1 (i.e., 0.31).

The criticality of timing pin 3 may be determined in the same fashion as the criticalities of timing pins 1-2. Specifically, the criticality of timing pin 3 is determined by prob (S3≦min(S1, S2, S3)) which may be determined as follows:

criticality 3=prob(S3−min(S1,S2,S3))= prob($-1-3.5x_1-3x_2-(-2.46-2.77x_1-3x_2$)≦0)=prob ($1.46-0.73x_1$≦0)

Then, using a probability distribution table with inputs 1.46 and 0.73 serving as the mean and standard deviation values, the criticality of timing pin 3 is determined to be 0.02.

Then according to the method 300, the statistical timing analysis and optimization module 208 normalizes the criticalities of the timing pins (block 310). As described herein, normalized criticalities are capitalized, and criticalities not normalized are not capitalized. The normalization of each criticality may be determined by the following relationship:

Criticality_i=criticality_i/Sum{Prob[S_k≦S_Ckt]} for all k in set Ω

As discussed above, the special sub-independent critical set 0 is timing pins 1 or 2 and 3, since the slacks of 1 and 2 are the same. As discussed above, the prob[S_1≦S_Ckt] has been determined to be 0.31, and the prob[S_3≦S_Ckt] has been determined to be 0.02. Using this normalization relationship, the normalized Criticalities of timing pins 1 and 2 may be determined as follows:

Criticality_1=Criticality_2=0.31/(0.31+0.02)=0.94

And, the normalized Criticality of timing pin 3 may be determined as follows:

Criticality_3=0.02/(0.31+0.02)=0.06

Thus, according to this example, the probabilities of timing pins 1 and 2 being on the path with the worst slack is 94 percent, and the probability of timing pin 3 being on the path with the worst slack is 6 percent.

Proceeding to the next independent critical set, namely timing pins 4, 5, and 9, each of these have a single fanin. Therefore, the Criticalities of timing pins 4, 5, and 9 are respectively the same as the Criticalities of timing pins 1-3, respectively. Accordingly, the Criticalities of timing pins 4, 5 and 9 are 0.94, 0.94, and 0.06, respectively. Thus, according to this example, the probabilities of timing pins 4 and 5 being on the path with the worst slack is 94 percent, and the probability of timing pin 9 being on the path with the worst slack is 6 percent.

Proceeding to the next independent critical set, namely timing pins 6 and 9, the statistical timing analysis and optimization module 208 determines the minimum of the slacks for timing pins 6 and 9 (min(S6, S9)). As discussed above, this may be determined by techniques for determining the minimum of a finite set of random variables. In this example, the min(S6, S9) is determined to be $-2.46-2.77x_1-3x_2$. Then, the criticality of timing pin 6 is determined by the probability of the slack of timing pin 6 (S6) being less than or equal to the minimum of slacks 6 and 9 as follows:

criticality_6=prob(S6≦min(S6,S9)= prob($-2.45-2.75x_1-3x_2-(-2.46-2.77x_1-3x_2$)≦0)=prob($0.01-0.02x_1$≦0)

Then, using a probability distribution table with inputs 0.01 and 0.02 serving as the mean and standard deviation values, the criticality of timing pin 6 is determined to be 0.31. The Criticality of timing pin 9 has already been determined to be 0.06.

Then, the statistical timing analysis and optimization module 208 normalizes the criticality of timing pin 6 per block 310. In case where one or more Criticalities in the independent critical set have already been computed, the module 208 first determines the set M of timing pins in the independent critical set whose Criticalities have already been computed. The module 208 also determines the remaining set N of timing pins in the independent critical set. Among the timing pins in set M, the module 208 determines whether any two or more of the timing pins (subset O) have substantially the same slacks. In such a case, the module 208 averages their criticalities, and treats the average as a single Criticality "j". Avg_O is then defined as the average of the Criticalities in set O. Additionally, the module 208 also determines whether any of the timing pins (subset P) in set N have substantially the same slack associated with the single Criticality "j". In such a case, the Criticalities of timing pins in subset P are assigned the Criticality "j". Then, the module 208 determines the normalized Criticality "i" for each timing pin in the set N-P by the following relationship:

Criticality_i=criticality_i*(1−(Sum of Criticalities in set (M−O)+Avg_O))/{Sum of criticalities in set (N−P)}

Thus, in this example, wherein independent critical set is timing pins 6 and 9, the Criticality of timing pin 9 has already been determined as 0.06. Thus, set M consists of a single timing pin 9 and set N consist of a single timing pin 6. Subsets O and P, in this example, are null. Accordingly, the normalized criticality of timing pin 6 may be determined as follows:

Criticality_6=criticality_6*(1−Sum of Criticalities of M)/(Sum of criticalities of N=0.31*(1−0.06)/ 0.31=0.94

Thus, according to this example, the probability of timing pin 6 being on the path with the worst slack is 94 percent.

Proceeding to the next independent critical set, namely timing pins 7-9, the statistical timing analysis and optimization module 208 determines the minimum of the slacks for timing pins 7-9 (min(S7, S8, S9)). As discussed above, this may be determined by techniques for determining the minimum of a finite set of random variables. In this example, the min(S7, S8, S9) is determined to be $-2.45-2.77x_1-3x_2$. Then, the criticality of timing pin 7 is determined by the probability of the slack of timing pin 7 (S7) being less than or equal to the minimum of slacks 7-9 as follows:

$$\text{criticality\_7} = \text{prob}(S7 \leq \min(S7,S8,S9)) = \text{prob}(-2-3x_1-2.5x_2-(-2.45-2.77x_1-3x_2) \leq 0) = \text{prob}(0.45-0.23x_1+0.5x_2 \leq 0)$$

Then, using a probability distribution table with inputs 0.45 as the mean and Sqrt $(0.23^2+0.5^2)$ as the standard deviation values, the criticality of timing pin 7 is determined to be 0.207.

Similarly, the criticality of timing pin 8 may be determined as follows:

$$\text{criticality\_8} = \text{prob}(S8 \leq \min(S7,S8,S9)) =$$

$$\text{prob}(-2-2.5x_1-3.5x_2-(-2.45-2.77x_1-3x_2) \leq 0) = \text{prob}(0.45+0.27x_1-0.5x_2 \leq 0)$$

Then, using a probability distribution table with inputs 0.45 as the mean and Sqrt $(0.27^2+0.5^2)$ as the standard deviation values, the criticality of timing pin 8 is determined to be 0.214. The Criticality of timing pin 9 has already been determined as 0.94.

Then, the statistical timing analysis and optimization module 208 normalizes the criticalities of timing pins 7 and 8 per block 310. In this example, the normalized Criticality of timing pin 7 may be determined as follows:

$$\text{Criticality\_7} = (1-\text{Criticality\_9})*(\text{criticality\_7}/(\text{criticality\_7}+\text{criticality\_8})) = (1-0.06)*(0.207/(0.207+0.214)) = 0.46$$

The normalized Criticality of timing pin 8 may be determined as follows:

$$\text{Criticality\_8} = (1-\text{Criticality\_9})*(\text{criticality\_8}/(\text{criticality\_7}+\text{criticality\_8})) = (1-0.06)*(0.214/(0.207+0.214)) = 0.48$$

Thus, according to this example, the probabilities of timing pin 7 being on the path with the worst slack is 46 percent, and the probability of timing pin 8 being on the path with the worst slack is 48 percent.

Proceeding to the next independent critical set, namely timing pins 10 and 11, the statistical timing analysis and optimization module 208 determines the minimum of the slacks for timing pins 10 and 11 (min(S10, S11)). As discussed above, this may be determined by techniques for determining the minimum of a finite set of random variables. In this example, the min(S10, S11) is determined to be $-2.44-2.83x_1-3.0x_2$.

Then, the criticality of timing pin 11 is determined by the probability of the slack of timing pin 11 being less than or equal to the minimum of slacks 10 and 11 as follows:

$$\text{Criticality\_11} = \text{prob}(S11 \leq \min(S10,S11)) =$$

$$\text{prob}(-2.11-2.69x_1-3.41x_2-(-2.44-2.83x_1-3.0x_2) \leq 0) = \text{prob}(0.33-0.14x_1-0.41x_2 \leq 0)$$

Then, using a probability distribution table with inputs 0.3 as the mean value and Sqrt $(0.14^2+0.414^2)$ as the standard deviation, the criticality of timing pin 11 is determined to be 0.207. Since timing pin 10 has a single fanin, the criticality of timing pin 10 is the same as the criticality of timing pin 7, which is equal to 0.46.

Then, the statistical timing analysis and optimization module 208 normalizes the criticalities of timing pins 10 and 11. In this example, the normalized Criticality of timing pin 11 may be determined as follows:

$$\text{Criticality\_11} = (1-\text{Criticality\_10})*(\text{criticality\_11}/(\text{criticality\_11}))$$

$$= (1-0.46)*(0.207/(0.207)) = 0.54$$

Thus, according to this example, the probability of timing pin 10 being on the path with the worst slack is 46 percent, and the probability of timing pin 11 being on the path with the worst slack is 54 percent.

The following table summarizes the normalized timing Criticalities for the timing pins of the circuit design 500:

| TIMING PINS | CRITICALITIES |
|---|---|
| 1 | 0.94 |
| 2 | 0.94 |
| 3 | 0.06 |
| 4 | 0.94 |
| 5 | 0.94 |
| 6 | 0.94 |
| 7 | 0.46 |
| 8 | 0.48 |
| 9 | 0.06 |
| 10 | 0.46 |
| 11 | 0.54 |

The Criticalities of the timing pins are also illustrated next to the corresponding timing pins shown in FIG. 4E.

Then, according to the method 300, the statistical timing analysis and optimization module 208 sorts the criticalities of the timing pins in chronological order (block 312). For example, the criticalities may be sorted from high to low to more easily identify portions of the circuit design 400 that need further timing optimization. The sorted criticalities also make it easier to identify portions of the circuit design 400 that can give up some slack to improve the slack of that portion that needs further optimization. Then, according to the method 300, the statistical timing analysis and optimization module 208 optimizes the circuit design 400 based on the order of the criticalities of the timing pins (block 314).

Figure 5:
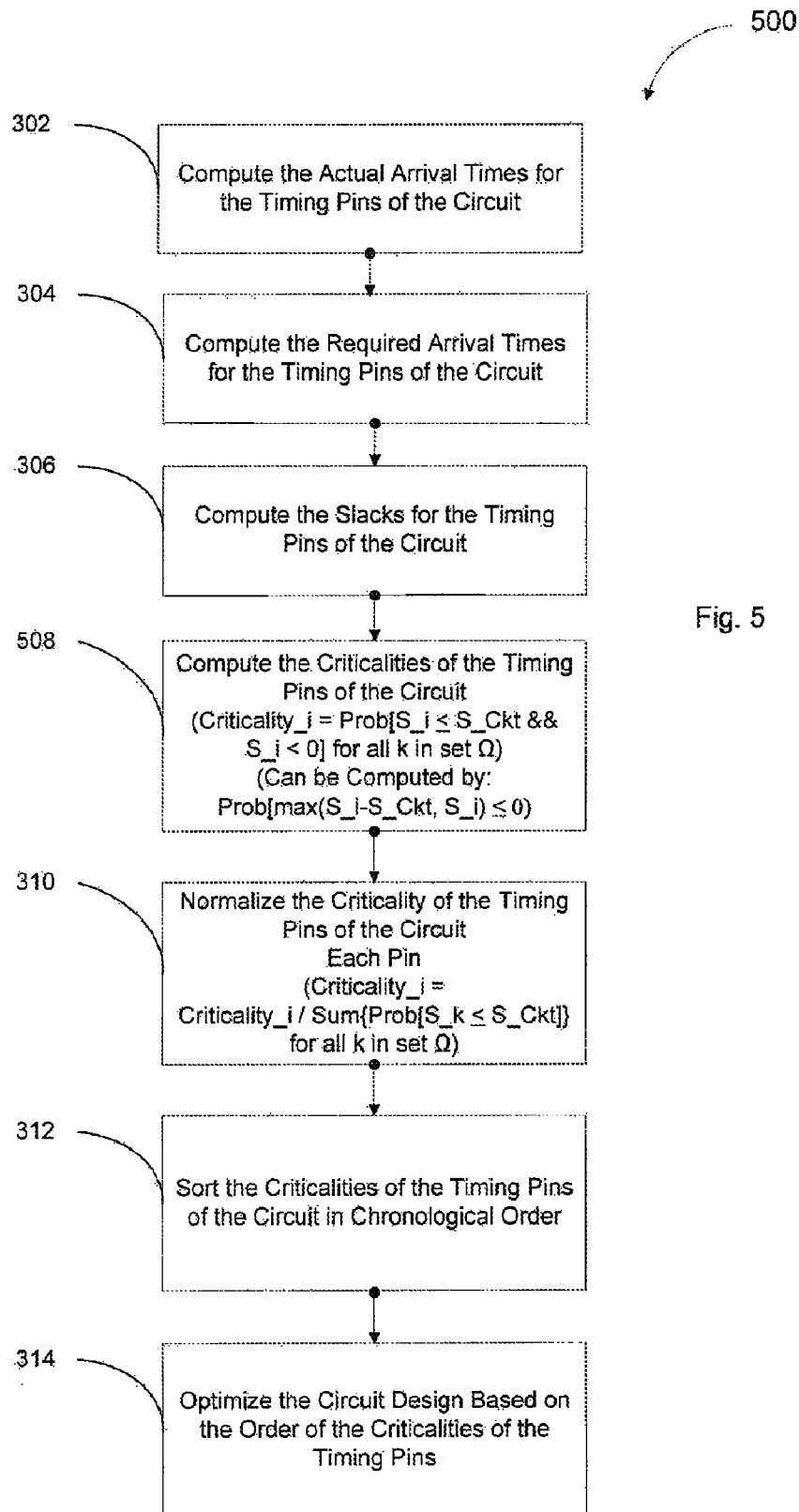
FIG. 5 illustrates a flow diagram of another exemplary method of optimizing a circuit design in accordance with another embodiment of the invention.

FIG. 5 illustrates a flow diagram of another exemplary method 500 of optimizing a circuit design in accordance with another embodiment of the invention. The method 500 may be used to determine the probability of a timing pin being on the path with the worst slack and the slack being less than zero (0). This is to identify portion of the circuit design that needs more timing optimization.

The method 500 is similar to the previously discussed method 300 in that they both include the operations 302, 304, 306, 310, 312, and 314 previously discussed in detail. However, the method 500 differs from method 300 in that it includes the operation 508 instead of 308 in that the computation of the criticality of a timing pin is based on the probability of the slack being the minimum in the corresponding independent critical set and the slack being less than zero (0)). Thus, the modified criticality of the ith timing pin may be computed as follows:

$$\text{Criticality\_}i = \text{Prob}[S\_i \leq S\_Ckt \ \&\& \ S\_i < 0] \text{ for all } k \text{ in set } \Omega$$

This criticality may be computed as follows:

$$\text{Criticality\_}i = \text{Prob}[\max(S\_i - S\_Ckt, S\_i) \leq 0]$$

In a similar manner, this may be determined by techniques of determining the maximum of a set of finite random variables.

Figure 6:
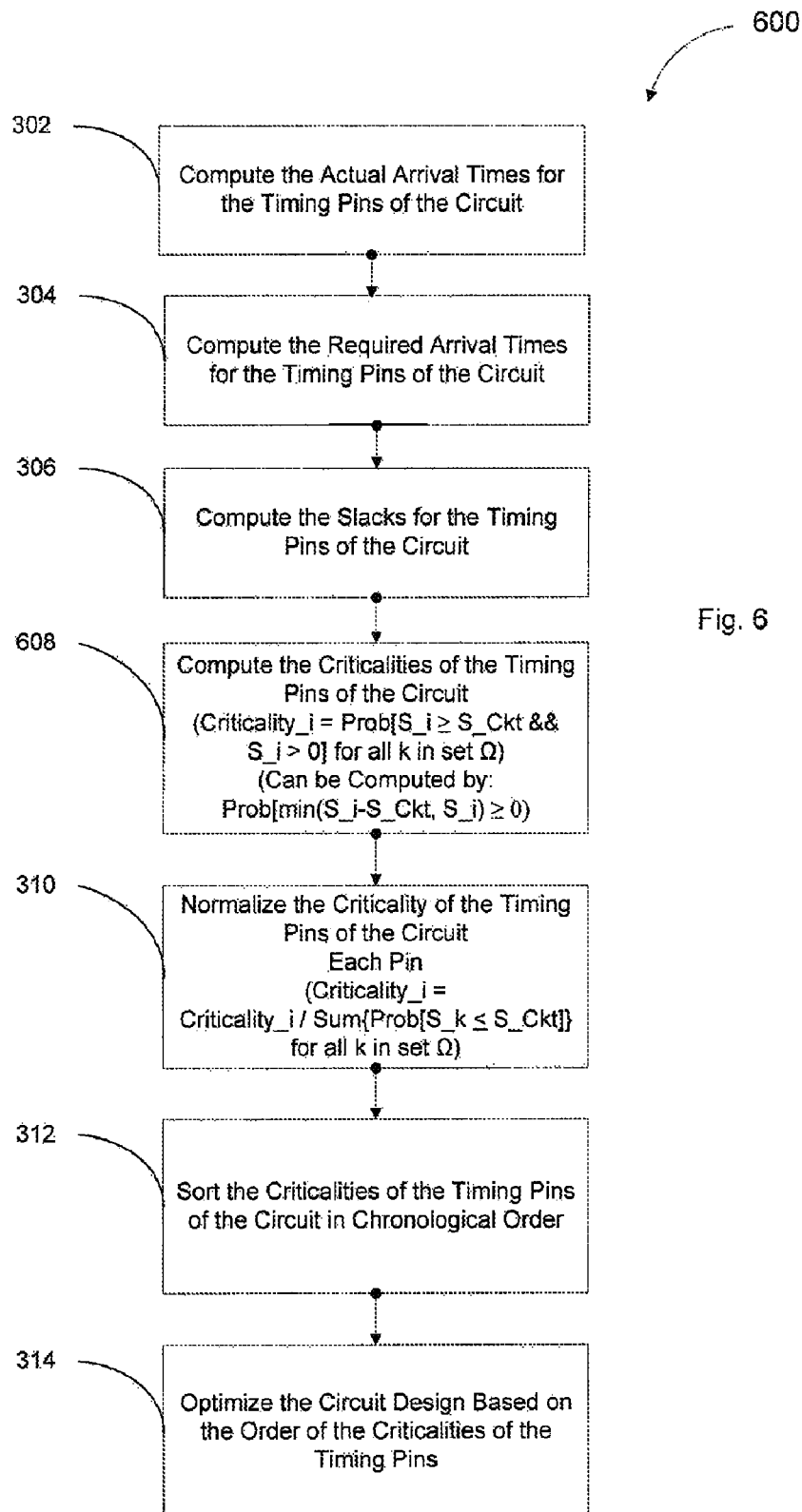
FIG. 6 illustrates a flow diagram of yet another exemplary method of optimizing a circuit design in accordance with another embodiment of the invention.

FIG. 6 illustrates a flow diagram of another exemplary method 600 of optimizing a circuit design in accordance with another embodiment of the invention. The method 600 may be used to determine the probability of a timing pin being on the path having the highest slack and the slack being greater than zero (0). This is to identify portion of the circuit design in which the timing may be compromised to improve other aspects of the circuit design.

Specifically, the method 600 is similar to the previously discussed method 300 in that they both include the operations 302, 304, 306, 310, 312, and 314 previously discussed in detail. However, the method 600 differs from method 300 in that it includes the operation 608 instead of 308 in that the computation of the criticality of a timing pin is based on the probability of the slack being the maximum in the corresponding independent critical set and the slack being greater than zero (0)). Thus, the modified criticality of the ith timing pin may be computed as follows:

$$\text{Criticality\_}i = \text{Prob}[S\_i \geq S\_Ckt \,\&\&\, S\_i > 0] \text{ for all } k \text{ in set } \Omega$$

This criticality may be computed as follows:

$$\text{Criticality\_}i = \text{Prob}[\min(S\_i - S\_Ckt, S\_i) \geq 0]$$

In a similar manner, this may be determined by techniques of determining the minimum of a set of finite random variables.

It shall be understood that the above exemplary embodiments were provided for the purpose of illustrating the invention. The exemplary methods 300, 500, and 600 described herein can be applied to the situation where the slacks are computed by any method and modeled in any forms, such as Gaussian or non-Gaussian random variables, linear or non-linear models of delays, etc.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A method of performing statistical timing analysis on a circuit design, the method comprising:
with a processor,
   determining one or more slacks respectively associated with each of one or more timing pins of the circuit design, wherein each slack associated with a timing pin is a random variable representing a minimum slack of all paths passing through the corresponding timing pin, and is a function of one or more process random variables, wherein the slack for each timing pin is computed by subtracting the actual arrival time from the required arrival time for each of the one or more timing pins; and
   determining a criticality respectively associated with each of the one or more timing pins of the circuit design from the one or more slacks that are functions of process random variables.

2. The method of claim 1, wherein
each criticality is a function of the slacks in an independent critical set of timing pins.

3. A method of performing statistical timing analysis on a circuit design, the method comprising:
with a processor,
   determining one or more slacks respectively associated with each of one or more timing pins of the circuit design, wherein each slack associated with a timing pin is a random variable representing a minimum slack of all paths passing through the corresponding timing pin, and is a function of one or more process random variables; and
   determining a criticality respectively associated with each of the one or more timing pins of the circuit design from the one or more slacks that are functions of process random variables,
   wherein each criticality is a function of the probability that the slack of the corresponding timing pin is the minimum of one or more slacks associated with timing pins in an independent critical set of timing pins.

4. The method of claim 3, further comprising:
determining a normalized criticality of each timing pin.

5. The method of claim 3, wherein
each criticality is a further function of the probability that the slack of the corresponding timing pin is less than zero.

6. The method of claim 5, further comprising:
determining a normalized criticality of each timing pin.

7. A method of performing timing analysis on a circuit design, the method comprising:
with a processor,
   determining one or more slacks respectively associated with each of one or more timing pins of the circuit design, wherein each slack associated with a timing pin is a random variable representing a minimum slack of all paths passing through the corresponding timing pin, and is a function of one or more process random variables; and
   determining a criticality respectively associated with each of the one or more timing pins of the circuit design from the one or more slacks that are functions of process random variables,
   wherein each criticality is a function of the probability that the slack of the corresponding timing pin is the maximum of one or more slacks associated with timing pins in an independent critical set of timing pins, and the probability that the slack of the corresponding timing pin is greater than zero.

8. The method of claim 7, further comprising:
determining a normalized criticality of each timing pin.

9. The method of claim 1, further comprising:
arranging the criticalities of the timing pins in chronological order.

10. The method of claim 1, further comprising:
modifying the circuit design for timing based on at least one criticality.

11. The method of claim 1, wherein
the criticality of a first timing pin is substantially the same as the criticality of a second timing pin, wherein the first timing pin is a single fanin from the second timing pin.

12. The method of claim 1, wherein
determining the slack and criticality are controlled by program instructions stored on a computer readable medium.

13. A circuit design system for modifying a circuit design, the circuit design system comprising a processor adapted to:
   determine one or more slacks respectively associated with each one or more timing pins of a circuit design, wherein each slack associated with a timing pin is a function of one or more process random variables, wherein slack for each of the one or more timing ins of the circuit design is determined by subtracting the actual arrival time from the required arrival time;

determine a criticality respectively associated with each of the one or more timing pins of the circuit design from the one or more slacks that are functions of process random variables; and modify the circuit design based on at least one criticality.

14. The circuit design system of claim 13, wherein each criticality is a function of the slacks in an independent critical set of timing pins.

15. A circuit design system for modifying a circuit design, the circuit design system comprising a processor adapted to:

determine one or more slacks respectively associated with each one or more timing pins of a circuit design, wherein each slack associated with a timing pin is a function of one or more process random variables, determine a criticality respectively associated with each of the one or more timing pins of the circuit design from the one or more slacks that are functions of process random variables, each criticality is a function of the probability that the slack of the corresponding timing pin is the minimum of one or more slacks associated with the timing pins in the independent critical set of timing pins; and modify the circuit design based on at least one criticality.

16. The circuit design system of claim 15, wherein the processor is further adapted to determine a normalized criticality of each timing pin.

17. The circuit design system of claim 15, wherein each criticality is a further function of the probability that the slack of the corresponding timing pin is less than zero.

18. The circuit design system of claim 17, wherein the processor is further adapted to determine a normalized criticality of each timing pin.

19. A circuit design system for modifying a circuit design, the circuit design system comprising a processor adapted to:

determine one or more slacks respectively associated with each one or more timing pins of a circuit design, wherein each slack associated with a timing pin is a function of one or more process random variables;

determine a criticality respectively associated with each of the one or more timing pins of the circuit design from the one or more slacks that are functions of process random variables, wherein each criticality is a function of the probability that the slack of the corresponding timing pin is the maximum of one or more slacks associated with the timing pins in the independent critical set of timing pins, and the probability that the slack of the corresponding timing pin is greater than zero.

20. The circuit design system of claim 19, wherein the processor is further adapted to determine a normalized criticality of each timing pin.

21. A method of modifying a circuit design, the method comprising:

with a processor, determining one or more slacks respectively associated with each of one or more timing pins of a circuit design, wherein each slack associated with a timing pin is a function of one or more process random variables and the slack for each timing pin is computed by subtracting the actual arrival time from the required arrival time for each of the one or more timing pins;

determining a criticality respectively associated with each of the one or more timing pins of the circuit design from the one or more slacks that are functions of process random variables; and modifying the circuit design to increase the slacks of timing pins having relatively high criticalities and to decrease the slacks of timing pins having relatively low criticalities.

22. The method of claim 21, wherein each criticality is a function of the probability that the slack of the corresponding timing pin is the minimum of one or more slacks associated with the timing pins in the independent critical set of timing pins.

23. The method of claim 21, further comprising: determining a normalized criticality of each timing pin.

* * * * *